(12) United States Patent
Malliaras et al.

(10) Patent No.: US 8,063,556 B2
(45) Date of Patent: Nov. 22, 2011

(54) CASCADED LIGHT EMITTING DEVICES BASED ON MIXED CONDUCTOR ELECTROLUMINESCENCE

(75) Inventors: George G. Malliaras, Aix en Provence (FR); Kiyotaka Mori, Tokyo (JP); Jason D. Slinker, Ithaca, NY (US); Daniel A. Bernards, Ithaca, NY (US); Hector D. Abruna, Ithaca, NY (US)

(73) Assignees: Panasonic Corporation, Osaka (JP); Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 12/691,905

(22) Filed: Jan. 22, 2010

(65) Prior Publication Data

US 2010/0117518 A1    May 13, 2010

Related U.S. Application Data

(62) Division of application No. 11/091,088, filed on Mar. 28, 2005, now Pat. No. 7,755,275.

(51) Int. Cl.
*H01J 63/02* (2006.01)
(52) U.S. Cl. .................. 313/505; 313/500; 313/506
(58) Field of Classification Search .......... 313/498–512; 428/690–691, 917; 438/26–29, 34, 82; 427/66.532–535, 539; 315/169.1, 169.3
See application file for complete search history.

(56) References Cited

U.S. PATENT DOCUMENTS

| | | | |
|---|---|---|---|
| 5,142,192 A * | 8/1992 | Takahashi et al. | 313/506 |
| 5,757,139 A | 5/1998 | Forrest et al. | |
| 6,166,489 A | 12/2000 | Thompson et al. | |
| 6,278,417 B1 | 8/2001 | Bock et al. | |
| 6,791,261 B1 * | 9/2004 | Shimoda et al. | 313/506 |
| 7,420,203 B2 | 9/2008 | Tsutsui et al. | |
| 2003/0022019 A1 | 1/2003 | Seo et al. | |
| 2005/0164032 A1 | 7/2005 | Ise et al. | |
| 2005/0189875 A1 | 9/2005 | Nakada | |

FOREIGN PATENT DOCUMENTS

WO    WO 02/091493    11/2002

OTHER PUBLICATIONS

Slinker et al., "Solid-state electroluminescent devices based on transition metal complexes," J. Chem. Comm., Jul. 2003, pp. 2392-2399 (© Royal Society of Chemistry).
Bernhard et al., "Electroluminescence in Ruthenlum(II) Complexes," J. Am. Chem. Soc. 2002, 124, pp. 13624-13628.

* cited by examiner

*Primary Examiner* — Toan Ton
*Assistant Examiner* — Fatima Farokhrooz
(74) *Attorney, Agent, or Firm* — RatnerPrestia

(57) ABSTRACT

A cascaded light emitting device. The cascaded light emitting device includes: a base electrode formed of a base electrode material and electrically coupled to a base voltage lead; a top electrode layer formed of a top electrode material and electrically coupled to a top voltage lead; a number of electroluminescent layers arranged between and electrically coupled to the base electrode and top electrode layer; and at least one middle electrode layer formed of a middle electrode material. Each of the middle electrodes is coupled between two juxtaposed electroluminescent layers. The electroluminescent layers include a mixed conductor that luminesces with a peak wavelength.

17 Claims, 9 Drawing Sheets

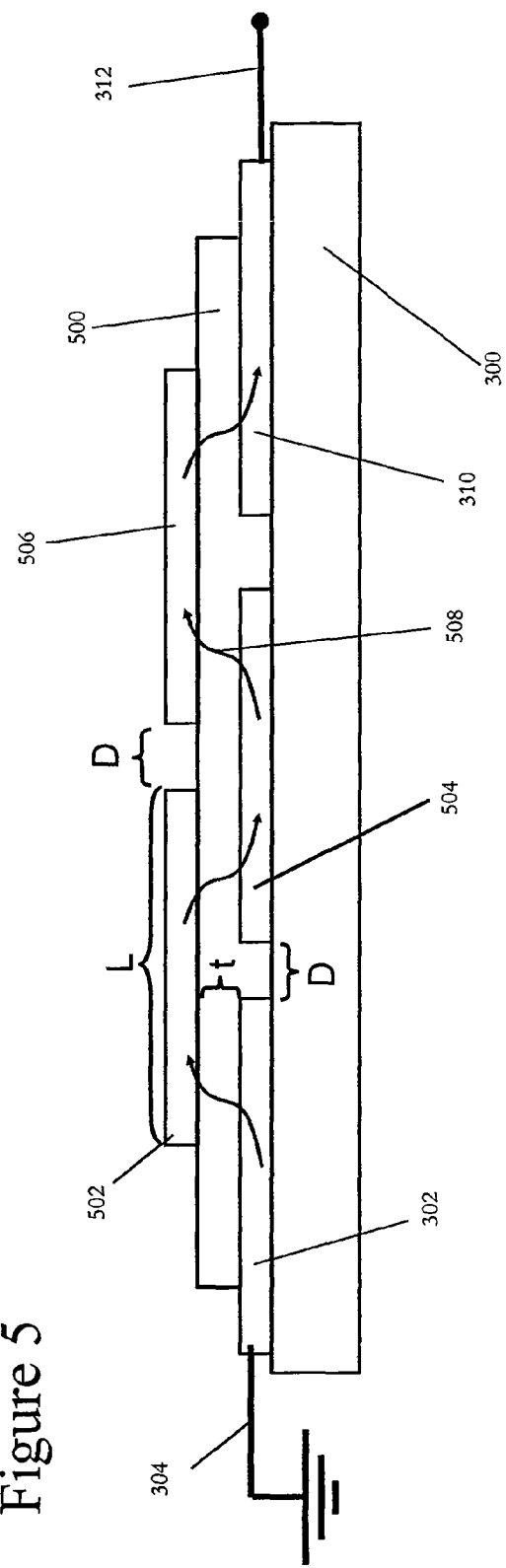
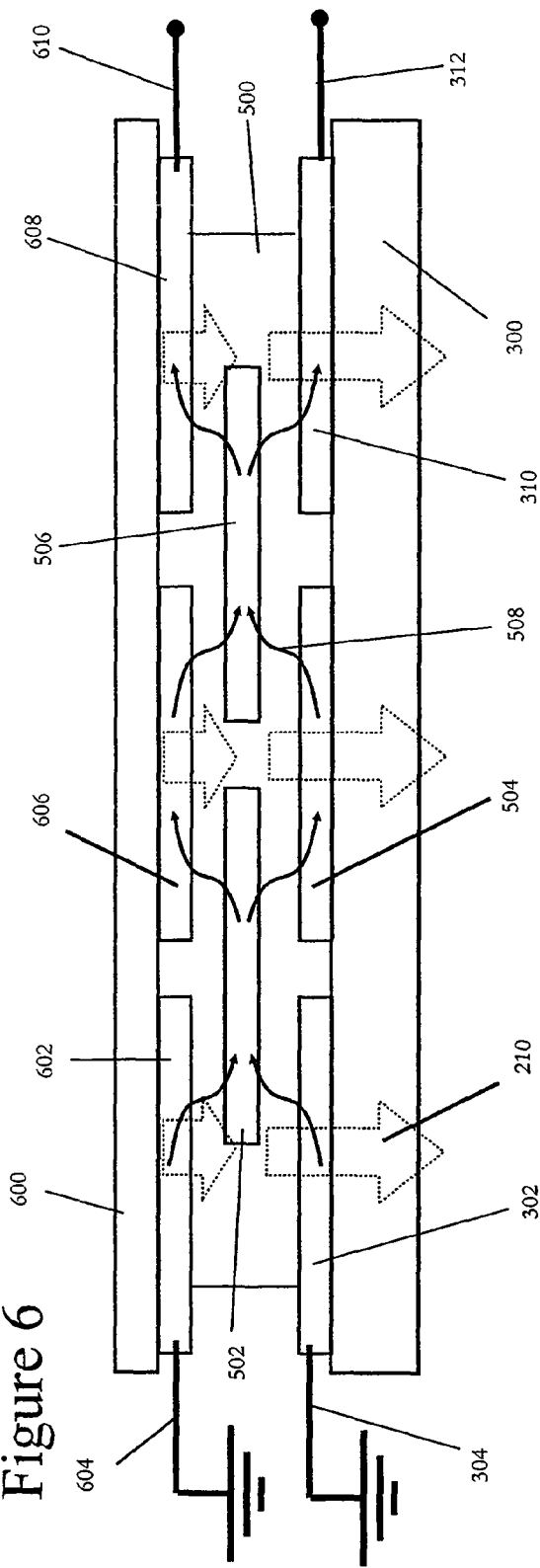
Figure 5
Figure 6

CASCADED LIGHT EMITTING DEVICES BASED ON MIXED CONDUCTOR ELECTROLUMINESCENCE

This application is a Divisional Application of U.S. patent application Ser. No. 11/091,088, filed Mar. 28, 2005. The contents of this application are incorporated herein by reference.

This work was supported by the National Science Foundation (Career Award DMR-0094047, and ECS-0210693) and by the Cornell Center for Materials Research (CCMR), a Materials Research Science and Engineering Center of the National Science Foundation (DMR-9632275).

FIELD OF THE INVENTION

The present invention concerns improved designs for light emitting devices based on electroluminescence. In particular, these designs may allow for the manufacture of displays with increased optical output, improved tolerance to shorts, and the ability to be driven using alternating current.

BACKGROUND OF THE INVENTION

Recently, there has been significant interest in organic light emitting diodes (OLED's). These structures have begun entering the flat panel display market. A variety of consumer electronics products, such as car stereos and cell phones, are also available with OLED-based displays. In addition to these uses, a number of other applications, such as large-area signs and panels for general lighting applications, are envisioned for OLED's. However, a number of issues remain before OLED-based displays are able to reach their full potential. For example, as the area of an OLED increases, the probability of an electrical short occurring within the diode structure also increases. In a passive matrix architecture, a short may cause all pixels that share the same row and column electrodes to stay dark, thus potentially dramatically decreasing the brightness of an entire panel. For a flat panel display, the loss of a large number of pixels due to a short in one OLED may lead to unacceptable image degradation. The active matrix architecture does not suffer from this shortfall; however, it can be expensive and difficult to implement this architecture over arbitrarily large areas. Therefore, alternative architectures that allow for the monolithic fabrication of large area OLED panels, have tolerance to short circuits, and are compatible with low-cost manufacturing techniques (such as roll to roll) are desired.

A. R. Duggal, D. F. Foust, W. F. Nealon, and C. M. Heller at GE described an exemplary fault-tolerant architecture in an article published in Applied Physics Letters (vol. 82, pg. 2580 (2003)). They applied this exemplary architecture to the fabrication of an illumination panel. The panel consisted of individual OLED's that were placed side by side and were connected in series. This series connection was achieved by selectively removing the organic semiconductor from one edge of each device, thereby exposing the underlying anode electrode. The cathode of one device could then be electrically connected to the anode of its neighbor. Panels that exhibited fault tolerance and scalability were demonstrated. However, this architecture requires patterning of the organic layer, which increases the complexity of the manufacturing process and may lead to additional faults. Duggal et al. used laser ablation to pattern the organic layer. This step adds significantly to the complexity and might be detrimental to the speed of display manufacture.

Another alternative architecture for OLED's was proposed by J. Kido, T. Matsumoto, T. Nakada, J. Endo, M. Mori, N. Kawamura, and A. Yokoi, in their article HIGH EFFICIENCY ORGANIC EL DEVICES HAVING CHARGE GENERATION LAYERS, SID Digest, p. 964 (2003). This article focused on increasing the quantum efficiency of OLED's. Kido et al. described a cascaded OLED architecture where OLED devices were stacked on top of each other. Panels were built by repeating a basic unit that consisted of a metal, a p-type doped organic, an intrinsic organic, an n-type doped organic, and a metal. Repeating this structure twice gave two cascaded devices, in which the middle metal layer was injecting electrons in the n-type organic on one side, and holes in the p-type organic on the other. As a result of the doping, the middle electrode was able to serve both as an efficient anode, and as an efficient cathode. The cascaded configuration resulted in radiant flux and quantum efficiency that increased with the number of devices. Since the devices where stacked on top of each other, the radiant flux per unit area increased with the number of devices, leading to extremely bright panels. However, this architecture was specifically designed for increasing the efficiency of OLED's and was not meant to provide a fault tolerant way of building large area panels.

The present invention involves improved architectures for producing light emitting devices based on electroluminescence. These improved architectures may lead to simplified manufacture and allow for increased optical output, as well as increased tolerance to shorts.

SUMMARY OF THE INVENTION

An exemplary embodiment of the present invention is a cascaded light emitting device. The cascaded light emitting device includes: a base electrode formed of a base electrode material and electrically coupled to a base voltage lead; a top electrode layer formed of a top electrode material and electrically coupled to a top voltage lead; a number of electroluminescent layers arranged between and electrically coupled to the base electrode and top electrode layer; and at least one middle electrode layer formed of a middle electrode material. Each of the middle electrodes is coupled between two juxtaposed electroluminescent layers. The electroluminescent layers include a mixed conductor that luminesces with a peak wavelength.

Another exemplary embodiment of the present invention is a cascaded light emitting device. The cascaded light emitting device includes: a split electrode structure formed of a first electrode material; an opposing electrode formed of a second electrode material; and at least one electroluminescent layer coupled between the split electrode structure and the opposing electrode. The split electrode structure includes a number of electrode portions. The electrical resistance between any pair of these electrode portions of the split electrode structure (split resistance) is greater than a resistance across the electroluminescent layer(s) between an electrode portion of the split electrode structure and the opposing electrode. The electrode portions include a first electrode portion that is electrically coupled to a first voltage lead and a second electrode portion that is electrically coupled to a second voltage lead. The electroluminescent layer(s) includes a mixed conductor that luminesces with a peak wavelength. A total thickness of the electroluminescent layer(s) is such that the resistance across the electroluminescent layer(s) between an electrode portion of the split electrode structure and the opposing electrode is less than half of the split resistance.

A further exemplary embodiment of the present invention is a method for driving of an electroluminescent device with an alternating current where the electroluminescent device includes: a first electrode; a second electrode; and at least one electroluminescent layer coupled between the first electrode and the second electrode, which includes a mixed conductor. The electroluminescent device is biased to generate a polarizing voltage across the electroluminescent layer(s) from the first electrode to the second electrode. The polarization voltage is greater than or equal to the voltage necessary to enhance charge injection into the mixed conductor. The potential difference across the electroluminescent layer(s) from the first electrode to the second electrode is maintained above an operational voltage for a predetermined luminescence period. The operational voltage is less than or equal to the polarizing voltage and greater than or equal to the voltage necessary to drive electroluminescence in the polarized mixed conductor. The electroluminescent device is biased to generate the polarizing voltage across the electroluminescent layer(s) from the second electrode to the first electrode and the potential difference across the electroluminescent layer(s) from the second electrode to the first electrode is maintained above an operational voltage for the predetermined luminescence period. The steps are then repeated.

An additional exemplary embodiment of the present invention is a method for rectifying an input electric signal having a varying voltage. An electroluminescent device that includes a mixed conductor is driven with the electric signal to generate an optical signal having an intensity proportional to an absolute value of the varying voltage of the electric signal. The optical signal of the electroluminescent device is detected to generate a rectified electric signal.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures:

FIG. 5 is a cut away side plan drawing illustrating an exemplary cascaded mixed conductor OEL device according to the present invention.

FIG. 6 is a cut away side plan drawing illustrating an alternative exemplary cascaded mixed conductor OEL device according to the present invention.

DETAILED DESCRIPTION OF THE INVENTION

As discussed above, device architectures involving the series connection of electroluminescent cells in the prior art require patterning not only of the electrodes, but also of the luminescent layer. Additionally in these prior art designs, the resulting light is generated in light emitting diode configurations. Exemplary embodiments of the present invention include stacked and cascaded electroluminescent (OEL) device architectures that do not require patterning of electroluminescent layer. These exemplary device architectures also utilize mixed conductors to produce electroluminescence without the need to produce diode structures. This feature allows the use of alternating current (AC) driving signals in exemplary embodiments of the present invention. Further, the present invention allows a simplified manufacturing process that may provide high yield and reduced manufacturing costs.

Figure 1A:
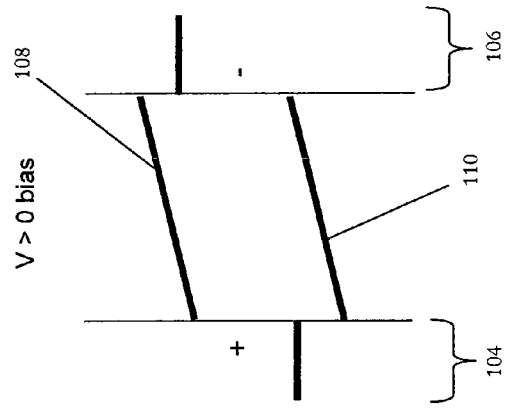
FIGS. 1A, 1B, 1C, and 1D are energy diagrams that illustrate exemplary band bending in mixed conductors such as may be used in any of the exemplary devices of the present invention.

FIGS. 1A-D are intuitive energy diagrams illustrating some of the desirable properties of an exemplary light emitting device using a mixed conductor. FIG. 1A illustrates that the unbiased work functions of electrodes 104 and 106 fall somewhere in between lowest unoccupied molecular orbital (LUMO) 100 and highest occupied molecular orbital (HOMO) 102 of a material coupled between the electrodes. The LUMO and HOMO levels of the material may be considered as analogous to the conduction and valence band edges, respectively, of semiconductors. Electrons and holes encounter this energy gap when traveling from electrodes 104 and 106 into the material.

Figure 1C:
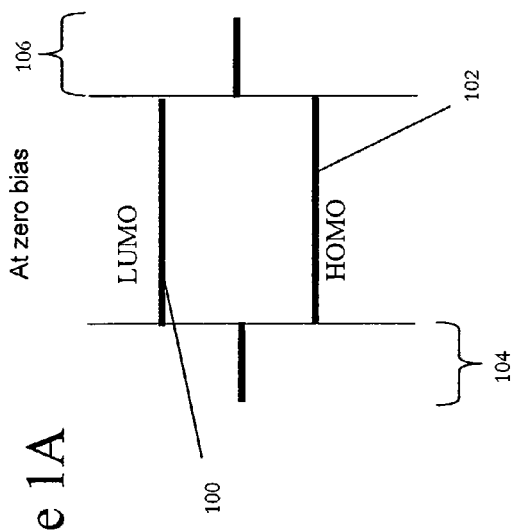
Figure 1B:
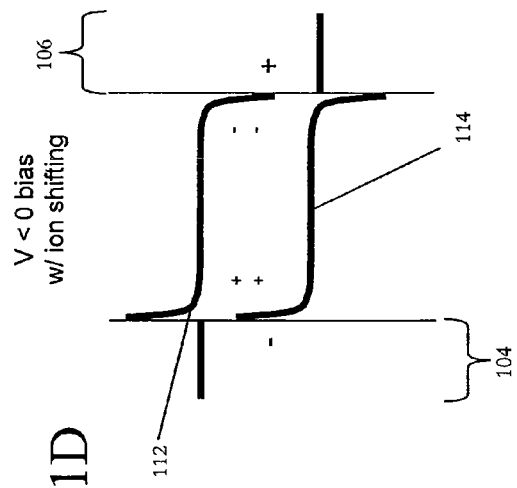

FIG. 1B illustrate the result of applying a voltage to across the electrodes from electrode 104 to electrode 106 when the material is a semiconducting material. The work functions of the electrodes change their position to match the Fermi level through the device, LUMO 108 and HOMO 110 become sloped. There remains a potential gap for charge injection, which may decrease the efficiency of the device, particularly at smaller voltage levels. In some cases, the potential gap may still be too large for charge to be injected into the material, which may lead to an undesirably high turn on voltage.

Figure 1D:
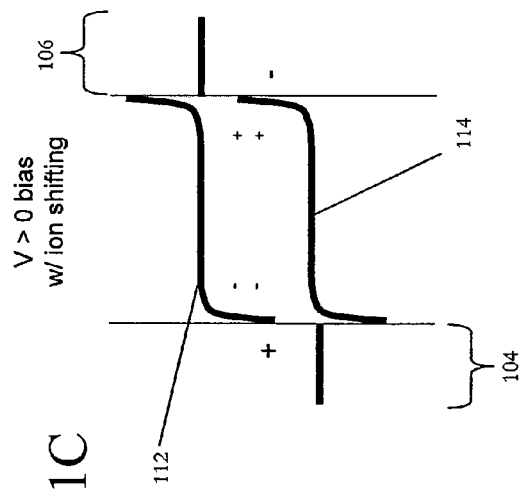

Mixed conductors are materials that have more than one mechanism of conducting charge. Ions and electrons (or holes) are two examples of conducting mechanism that a mixed conductor may include. In mixed conductors, ion shifting may occur due to an applied voltage and, thus, polarize the material. In the exemplary embodiments of the present invention it is contemplated that both organic and inorganic mixed conductors may be used. FIGS. 1C and 1D illustrate the effect of ion shifting in a mixed conductor on the band structure. The ion shift may induce band bending, as shown by LUMO's 112 and HOMO's 114 in FIGS. 1C and 1D. Thus, electrons and holes may be injected more easily from electrodes 104 and 106 into the polarized mixed conductor layer.

In an exemplary OEL device, the mixed conductor material may desirably include at least one part to emit light and at least one part that may enhance charge injection under either a DC or an AC field, desirably based on band bending adjacent to the electrodes. This mixed conductor material may desirably form a light emitting layer. One example of such a material is a metal complex whose charges are compensated by counter ions. Charged transition metal complexes, such as $[Ru(dtb-bpy)_3]^{2+}$ $(PF_6)^-{}_2$, $[Ru(bpy)_3]^{2+}$ $(PF_6)^-{}_2$, and $[Os(bpy)_2\text{-}L)]^{2+}$ $(PF_6)^-{}_2$.(where dtb-bpy is 4,4'-di-t-butyl-2,2'-bipyridyl, bpy is 2,2'-bipyridine, L is cis-1,2-bis(diphenylphosphino)ethylene), are mixed conductors, as well as platinum (II) complexed with Bis[2-(2-phenyl)pyridinato-N,C2], Bis[2-(2'-thienyl) pyridinato-N,C3], and Bis[benzo(h) quinolinato-N,C]. Other transition metal complexes include $[Ir(ppy)_2(dtb-bpy)]^+$ $(PF_6)^-$ (ppy: 2-phenylpyridine, dtb-bpy: 4,4'-di-tert-butyl-2,2'-dipyridyl) and related derivatives of other di-immine-type ligands. $[Ru(dtb-bpy)_3]^{2+}$ is a semiconductor, with a filled HOMO and an empty LUMO, located on the metal and the ligand, respectively. In addition, the counter ions (which may be $(PF_6)^-$, $(BF_4)^-$, $(ClO_4)^-$, or another anion) show some finite (albeit low) mobility in the film, enabling ionic conductivity. As a result, the mechanism of device operation may be similar to exemplary light-emitting electrochemical cells disclosed by Q. B. Pei, G. Yu, C. Zhang and A. J. Heeger (Science 269, 1086 (1995)) and J. C. deMello, N. Tessler, S. C. Graham and R. H. Friend (Phys. Rev. B 57, 12951 (1998)).

As shown in FIGS. 1C and 1D, under the application of a bias, a mixed conductor may become polarized. For example, in the case of $[Ru(dtb-bpy)_3]^{2+}$ $(PF_6)^-{}_2$, the $(PF_6)^-$ counter ions may redistribute, leading to excess negative charge near the positively biased electrode and excess positive charge near the negatively biased one. This redistribution of ionic charge in $[Ru(dtb-bpy)_3]^{2+}$ $(PF_6)^-{}_2$, was discussed by deMello et al. It may desirably create large electric fields at the contacts and may, thus, enhance injection of electrons and holes into the LUMO and HOMO, respectively, of the ruthenium complex. The magnitude of this enhancement was found to be enough to allow the use of air stable electrodes, such as indium tin oxide (ITO) and gold, as ohmic contacts for both hole and electron injection as disclosed by S. Bernhard, X. Gao, G. G. Malliaras and H. D. Abruña (Adv. Mater. 14, 433 (2002)); S. Bernhard, J. A. Barron, P. L. Houston, H. D. Abruña, J. L. Ruglovksy, X. Gao and G. G. Malliaras (J. Am. Chem. Soc. 124, 13624 (2002)); and A. Gorodetsky, S. Parker, J. Slinker, D. Bernards, M. H. Wong, S. Flores-Torres, H. D. Abruña and G. G. Malliaras (Appl. Phys. Lett. 84, 807 (2004)).

Other examples of mixed conductors include ionic liquids and composited materials formed from a number of metal complexes and/or ionic liquids. Ionic liquids include: 1-Butyl-3-methylimidazolium hexafluorophosphate and related imidazolium derivatives; 1-Ethyl-3-methylimidazolium tosylate (EMIM-Ts); 1-Butyl-3-methylimidazolium octyl sulfate (BMIM-OctSO$_4$); 1-Butyl-3-methylimidazolium 2-(2-methoxyethoxy)ethyl sulfate (BMIM-MDEESO$_4$); and 3-Methyl-1-propylpyridinium bis(trifluormethylsulfonyl) imide (PMPIm) and related Pyridinium derivatives.

OEL devices made from $[Ru(bpy)_3]^{2+}$ $(PF_6)^-{}_2$, were pioneered by a group at MIT in 1999 (E. S. Handy, A. J. Pal and M. F. Rubner, J. Am. Chem. Soc. 121, 3525 (1999)). These devices have received increasing attention since. (See F. G. Gao and A. J. Bard, J. Am. Chem. Soc. 122, 7426 (2000); H. Rudmann and M. F. Rubner, J. Appl. Phys. 90, 4338 (2001); C. Y. Liu and A. J. Bard, J. Am. Chem. Soc. 124, 4190 (2002); H. Rudmann, S. Shimada and M. F. Rubner, J. Am. Chem. Soc. 124, 4918 (2002); M. Buda, G. Kalyuzhny and A. J. Bard, J. Am. Chem. Soc. 124, 6090 (2002); J. Slinker, D. Bernards, P. L. Houston, H. D. Abruña, S. Bernhard, and G. G. Malliaras, Chem. Comm. 19, 2392 (2003); Gorodetsky, et al.; and the previously listed articles by Bernhard, et al. in Adv. Mater and J. Am. Chem. Soc.)

Figure 2:
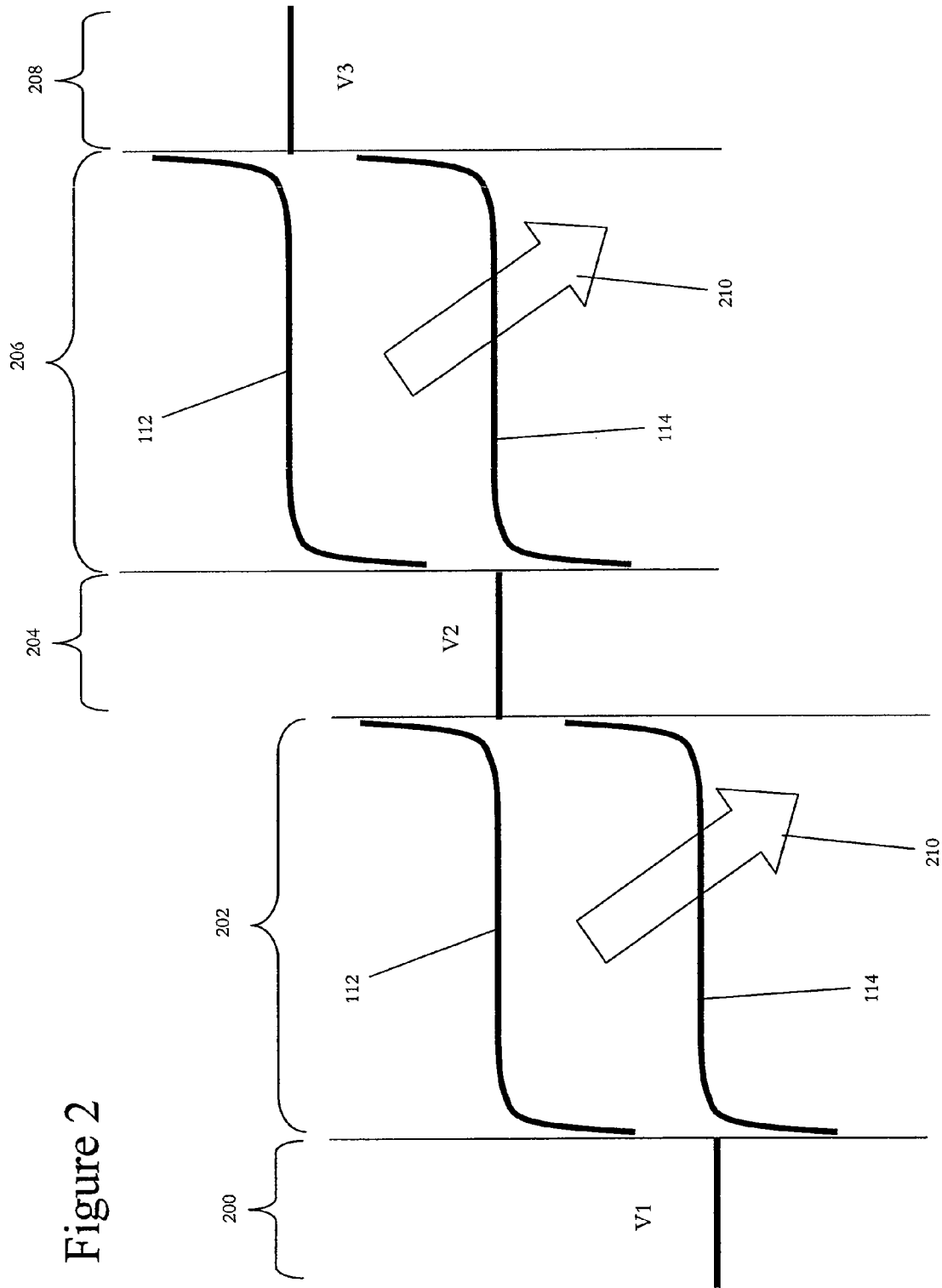
FIG. 2 is an energy diagram illustrating band structures of an exemplary cascaded mixed conductor electroluminescence (OEL) device according to the present invention.

FIG. 2 shows an energy diagram for an exemplary structure formed by cascading (or stacking) two light emitting layers using mixed conductor layers 202 and 206, which are coupled between electrodes 200 and 208. According to deMello et al., upon application of a voltage close to the HOMO-LUMO gap of $[Ru(dtb-bpy)_3]^{2+}$ across one device, the ionic space charge causes the molecular equivalent of band bending, which results in the alignment of the HOMO and LUMO with the Fermi levels of the anode and the cathode, respectively. When two devices are connected in series, middle electrode 204 is floating. Its potential adjusts to half of the applied bias, allowing middle electrode 204 to act as an anode for one device and a cathode for the other. This, of course, happens provided that the applied bias is now twice that of the HOMO-LUMO gap. Middle electrode 204 maintains its potential by injecting a hole into mixed conductor layers 206, for each electron it injects into mixed conductor layers 202. As a result, for every electron and hole injected by outer electrodes 200 and 208, two photons 210 are emitted, leading to a doubling of the external quantum efficiency. It is noted that the number of mixed conductor layers that may be cascaded in this manner is not limited to two.

The concept of stacking OLED's was demonstrated by J. Kido et al. However, unlike the exemplary OEL structure illustrated in FIG. 2, the OLED's used by Kido et al. require charge generation layers. Beyond the addition of these charge generation layers, doping of the layers and/or other additional processing steps may be required as well. Panels were built by repeating a basic unit that consisted of a metal, a p-type doped organic, an intrinsic organic, an n-type doped organic, and a metal. Repeating this structure twice gave two cascaded devices, in which the middle metal layer was injecting electrons in the n-type organic on one side, and holes in the p-type organic on the other. As result of the doping, the middle electrode was able to serve both as an efficient anode and as an efficient cathode.

Figure 3:
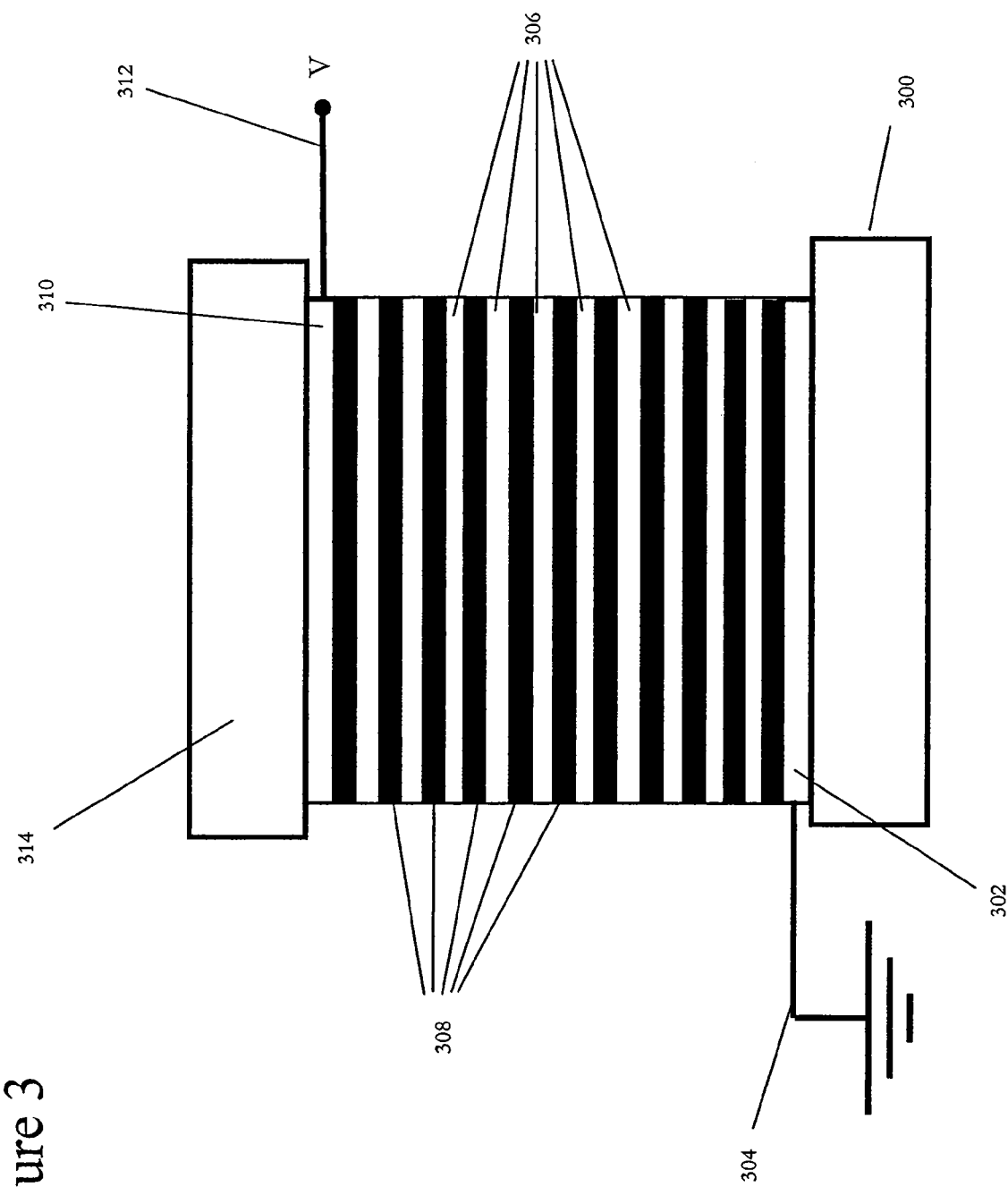
FIG. 3 is a side plan drawing illustrating an exemplary stacked mixed conductor OEL device according to the present invention.

FIG. 3 illustrates an exemplary cascaded light emitting device having a multi-stacking structure according to the present invention. In this exemplary embodiment, a number of electroluminescent layers 308 are arranged between and electrically coupled to base electrode 302 and top electrode layer 310. Electroluminescent layers 308, which are interleaved with at least one middle electrode layer 306, include a mixed conductor that luminesces with a peak wavelength. Base electrode 302 may desirably be formed on substrate 300 and cover layer 314 may be formed on top electrode layer 310.

An advantage of this exemplary structure is the potential increased emission of light versus area. Also, this exemplary structure allows for increased resistance to manufacturing defects. For example, even if one electroluminescent layer 308 of the structure does not work due to defects, such as a short, or other reasons, the overall intensity is not necessarily decreased dramatically. Only a 1/N portion of the intensity decreases, where N is the number of electroluminescent layers 308. Unless the OEL device is to be operated near its design limit, this loss of intensity may even be compensated by increasing the current.

Desirably, substrate 300 is formed of a substrate material that is substantially electrically insulating. Cover layer 314 may desirably be formed of a cover material that is substantially electrically insulating. The substrate and/or cover layer may provide mechanical support to the other layers of exemplary OEL devices of the present invention. Substrate 300 and cover layer 314 may also desirably seal the various other layers of this exemplary cascaded OEL device to prevent degradation to the layers that may occur from exposure to ambient environmental conditions, including air or water vapor. A number of materials including glasses, plastics, intrinsic semiconductors, dielectrics, oxides and ceramics may be used for substrate and cover materials. Typically, at least one of substrate 300 and cover layer 314 are substantially transparent to the peak wavelength (or peak wavelengths) of electroluminescent layers 308. The other may be substantially reflective to increase the brightness of the exemplary OEL device in one direction. It is also desirable for the corresponding one of base electrode 302 or top electrode 310 to be substantially transmissive (or reflective) to the peak wavelength (or peak wavelengths) of electroluminescent layers 308.

It is noted that substrate 300 and/or cover layer 314 may be formed of conductive materials instead and may function as base electrode 302 or top electrode layer 310, respectively, in addition to their other functions.

Base electrode 302 is coupled to base voltage lead 304. It is noted that, although base voltage lead 304 is shown coupled to ground in FIG. 3, it is contemplated that this lead may alternatively be connected to another constant voltage level or to a varying, even alternating voltage source. Similarly, top electrode layer 310 is shown coupled to top voltage lead 312. The base electrode material, middle electrode material, and top electrode material may include one or more metal and metal alloy conductors, oxide conductors including ceramic conductors, carbon-based conductors, polymer conductors, electrolytes, ionic conductors, and composites of these conductors in a non-conducting matrix (i.e. polymer). Metal conductors may include gold, calcium, aluminum, silver, copper, nickel, titanium, tungsten, platinum, germanium, polysilicon, palladium, iridium, rhodium, and alloys thereof. Examples of oxide conductors include: tin oxide; indium-tin oxide; doped titanium dioxide; high temperature superconducting ceramics; Perovskite phase $ABO_3$ such as $CaVO_3$, $LnVO_3$, $LnNbO_3$, $CaCrO_3$, $BaCrO_3$, $LnCrO_3$, $CaMoO_3$, $BaMoO_3$, $BaMnO_3$, $LnMnO_3$, $CaFeO_3$, $BaFeO_3$, $LnFeO_3$, $CaRuO_3$, $SrCoO_3$, $BaCoO_3$, $LnRhO_3$, $BaIrO_3$, $BaNiO_3$, $BaSnO_3$, and $SrPbO_3$, $PbFeO_{2.5}$, $PbRuO_3$, $BiNiO_3$, and $PbSnO_3$; and Ruddlesden-Popper phases in the general structural family $A_{n+1}B_nO_{3n+1}$ such as $Ca_{n+1}Ti_nO_{3n+1}$ for $n \geq 2$, $Sr_{n+1}Ti_nO_{3n+1}$ for $n \geq 1$, $Ln_{n+1}Ti_nO_{3n+1}$, $Sr_{n+1}V_nO_{3n+1}$, $Sr_{n+1}Cr_nO_{3n+1}$, $Sr_{n+1}Mo_nO_{3n+1}$, $Ca_{n+1}Mn_nO_{3n+1}$, $Sr_{n+1}Mn_nO_{3n+1}$, $Sr_{n+1}Fe_nO_{3n+1}$, $Sr_{n+1}Ru_nO_{3n+1}$, $Ba_{n+1}Ru_nO_{3n+1}$, $Ln_{n+1}Co_nO_{3n+1}$, $Sr_{n+1}Rh_nO_{3n+1}$, $Sr_{n+1}Ir_nO_{3n+1}$, $Ln_{n+1}Ni_nO_{3n+1}$, $Ln_{n+1}Cu_nO_{3n+1}$, $Sr_{n+1}Sn_nO_{3n+1}$, $Ba_{n+1}Sn_nO_{3n+1}$, and $Ba_{n+1}Pb_nO_{3n+1}$, where $n \geq 1$ but more typically $1 \leq n \leq 3$. Carbon-based conductors may include carbon nanotubes, carbon black, glassy (vitreous) carbon, and graphite in its numerous forms. Polymer conductors include polyaniline, polypyrrole, polyacetylene, polythiophene, and their derivatives.

Each middle electrode 306 is coupled between two juxtaposed electroluminescent layers 308. Thus, middle electrode layers 306 are desirably substantially transparent to the peak wavelength (or peak wavelengths) of electroluminescent layers 308. Therefore, the middle electrode material may desirably include one or more substantially transmissive electrode materials, such as tin oxide, indium-tin oxide, gold, calcium, polyaniline, or polythiophene. It is noted that, although the exemplary embodiments of the present invention illustrated in FIGS. 3, 4, 5, and 6 are herein described in terms of either top or bottom emitting configurations, it is contemplated that side emitting devices may be formed as well. In such exemplary side emitting EL devices, it is not necessary for any of the various electrode layers to be substantially transmissive to the peak emitted wavelength.

FIG. 3 illustrates an exemplary OEL device in which each middle electrode layer 306 includes one middle electrode coupled between a pair of juxtaposed electroluminescent layers 308 such that the pair of juxtaposed electroluminescent layers is completely physically separated by the middle electrode. In other exemplary embodiments, such as the exemplary cascaded OEL device of FIG. 7, a single middle electrode layer 306 may include two or more separate middle electrodes coupled between different portions of a pair of juxtaposed electroluminescent layers.

Another exemplary embodiment of the present invention is a cascaded OEL device that may emit two or more peak wavelengths of light. Such an exemplary OEL device may be formed as shown in FIG. 3, except that the plurality o electroluminescent layers 308 include two distinct subsets of layers formed of different mixed conductors. A first subset of electroluminescent layers that include a mixed conductor that luminesces with a first peak wavelength, and a second subset of electroluminescent layers that include a different mixed conductor that luminesces with a second peak wavelength. These subsets of electroluminescent layers may be separated into groups or may alternate.

It is noted that one of the base electrode or the top electrode material (and associated substrate or cover material, if included) may be substantially transparent to all of the peak wavelengths to allow all to be transmitted from the same side of the exemplary multi-wavelength OEL device, or each may be designed to transmit only a predetermined selection of the subsets. Similarly, the middle electrode material may be varied between different middle electrode layers such that one or more peak wavelengths are preferentially transmitted toward the base or the top of the OEL device.

One particular embodiment of interest may be a multi-wavelength OEL device with three subsets of electroluminescent layers selected to emit red, green, and blue light. An exemplary OEL device formed in this manner may appear to produce any predetermined visible color, including white light.

Figure 4:
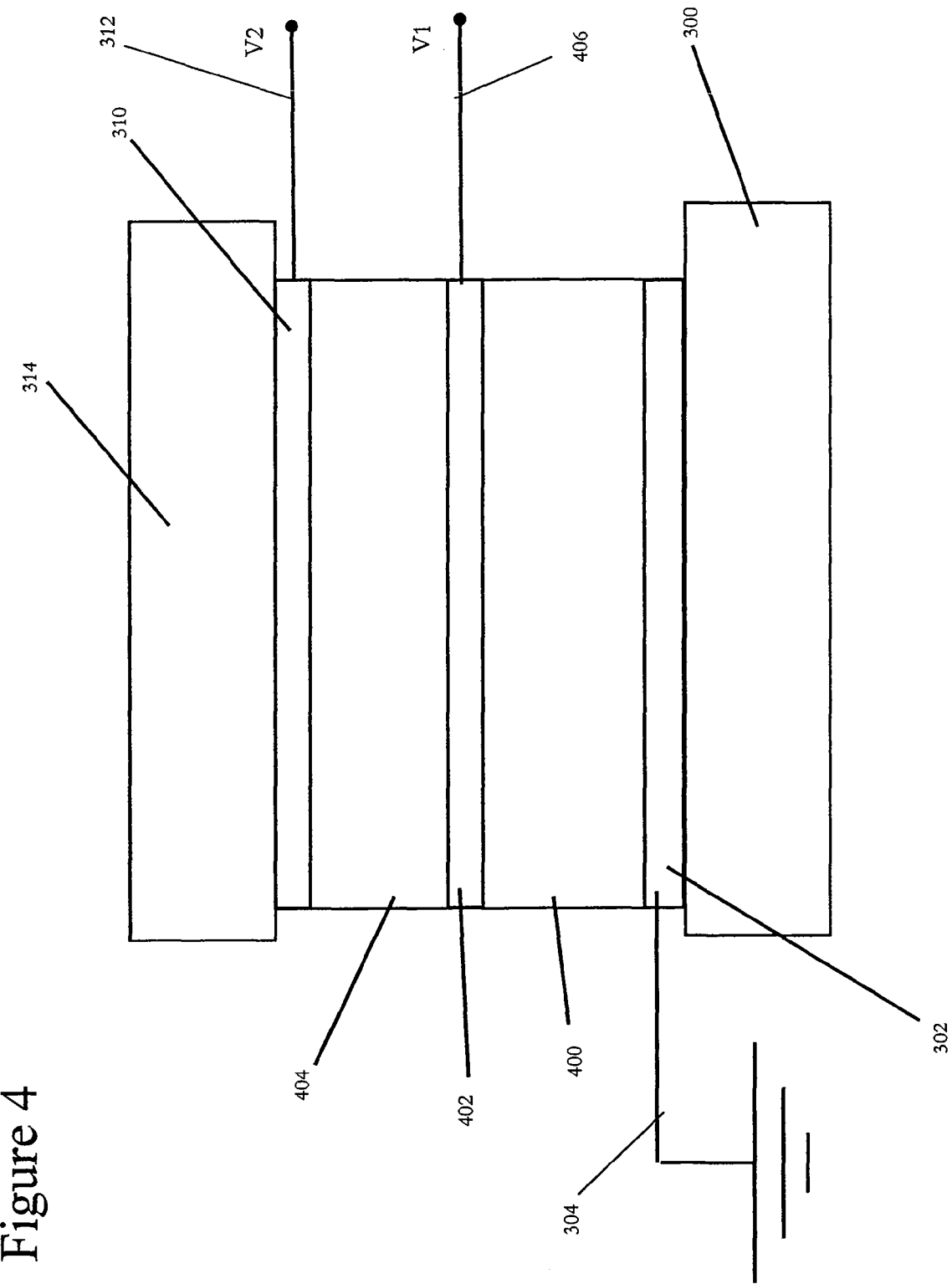
FIG. 4 is a side plan drawing illustrating an exemplary stacked mixed conductor OEL device with independent layer control according to the present invention.

FIG. 4 illustrates an alternative embodiment of the present invention in which middle electrode layer 402 is coupled to middle voltage lead 406. This exemplary embodiment allows the current flowing through electroluminescent layers 400 and 404 (and, thus, the light produced by each layer) to be controlled separately. It is noted that electroluminescent layers 400 and 404 may be replaced by cascaded OEL structures as illustrated in FIG. 3. This independent control may allow for more precise control of the optical output intensity of the device. Also, if electroluminescent layers 400 and 404 include mixed conductors that luminesce with different peak wavelengths, middle voltage lead 406 may function as a color control voltage lead to vary the intensity between the two peak wavelengths.

It is contemplated that this embodiment is not limited to two electroluminescent layers (or subsets of electroluminescent layers) and one middle voltage lead, but may include additional electroluminescent layers and middle voltage leads. For example, the previously discussed embodiment with three subsets of electroluminescent layers selected to emit red, green, and blue light may use two color control voltage leads, in conjunction with base voltage lead 304 and top voltage lead 312, to produce a single variable color OEL device. The output light of this exemplary device may be varied in both color and intensity throughout the visible light range. It is noted that a display using these exemplary OEL devices as pixels may provide an extremely high quality image.

FIG. 5 shows an alternative exemplary OEL device with a horizontally cascaded structure. This exemplary structure allows fabrication of cascaded OEL devices in a way that does not require patterning of the mixed conductor layer. The bottom, split electrode structure may be formed by patterning deposited electrode material formed on substrate 300 to create electrically isolated electrode portions 302, 504, and 310, each with a length, L, and separated a distance, D, from each other.

In an exemplary embodiment, this split electrode structure may be formed on a glass substrate by deposition through a shadow mask or using conventional photolithography. Electroluminescent layer 500, composed of a mixed conductor, may then be deposited as a continuous layer, and the fabrication may be completed with the deposition of the opposing electrode, which, in this case, is also split into opposing electrode portions 502 and 506. The opposing electrode may also be deposited through a shadow mask or using conventional photolithography. It desirably has the same pattern as the bottom electrode, but is translated by (L+D)/2 as shown in FIG. 5. As long as the electrical resistance across electroluminescent layer 500 from one of the split electrode portions to one of the opposing electrode portions and back to an adjacent one of the split electrode portions is less than the electrical resistance for current flowing directly between the two split electrode portions, current may flow through electroluminescent layer 500 to the various electrode portions, as indicated by arrows 508. One approach to obtain the conduction path shown by arrows 508 is for the thickness, t, (typically about 100 nm) of electroluminescent layer 500 is less than D/2. Alternatively, electrical barriers may be formed to promote the desired conduction path through electroluminescent layer 500.

In this exemplary configuration, each electrode portion acts simultaneously as an anode to one section and as a cathode to its neighbor, as well as an interconnect between the two sections. For the fabrication of a row of N cascaded devices, a total of N/2 opposing electrode portions are used. It is noted that, although FIG. 5 only shows a one dimensional stripe of OEL device sections, one skilled in the art may understand that this exemplary method may be extended to two dimensional arrays of OEL device sections.

As illustrated in FIG. 5, the end electrode portions 302 and 310 of the split electrode structure are coupled to voltage leads. Other electrode portions, including opposing electrode portions 502 and 506 and portion 504, may be connected to voltage leads. This may desirably allow independent control of different sections of the exemplary OEL device.

The exemplary architecture of the embodiment has intrinsic tolerance to short-circuits, as a shorted device does not disturb the current flow. For a panel formed in this manner that consists of M rows with N cascaded devices per row (hence M×N devices), a shorted device will only cause one device in the whole panel to stay dark. For N=M=10, such a panel will maintain 99% of its radiant flux. The same defect in a passive matrix architecture with M rows and N columns will cause both a column and a row (N+M−1 pixels) to stay dark. For N=M=10, the radiant flux will decrease to 81%.

In order to demonstrate the concept, a panel that consisted of a single row of cascaded devices was fabricated on an indium tin oxide (ITO) covered glass substrate. The ITO was patterned using Scotch tape as a mask and an HCl vapor etch, defining the pattern as shown in FIG. 5 with D=1 mm and L=3 mm. The width of the ITO stripes (hence the width of the row) was 3 mm. After patterning, the ITO substrates were cleaned in a deionized water bath, followed by a UV/ozone treatment. [Ru(dtb-bpy)$_3$]$^{2+}$(PF$_6$)$^-_2$ films were then spin coated from an acetonitrile solution (the synthesis and characterization of this material has been reported by Bernhard, et al. in J. Am. Chem. Soc. 2002, 124, 13624-13628). Typical film thickness was 100 nm as measured by profilometry. The films were dried in a vacuum oven for 12 hours at 60° C. and introduced into a nitrogen glove box for further processing and characterization.

Gold opposing electrodes 200 Å thick were then deposited through a shadow mask, defining the pattern as shown in FIG. 5 with D=1 mm and L=3 mm. The gold deposition was carried out by thermal evaporation under high vacuum ($10^{-6}$ mBar) at a rate of 1 Å/s and in an intermittent process to minimize damage to the ruthenium complex. This means of patterning resulted in panels with a single row of 4 cascaded devices, with an area of 3 mm$^2$ per device.

The current was measured with a Keithley 236 source-measure unit and the radiant flux with a calibrated UDT S370 optometer attached to an integrating sphere. Testing was performed by grounding one of the outermost ITO electrode sections and then applying a bias to a gold opposing electrode section or another ITO electrode section.

Thus, a certain number of devices (N, where 1≦N≦4) could be connected for testing. The current and radiant flux were monitored as a function of time, allowing enough time for the (PF$_6$)$^-$ counter ions to reach their equilibrium position. When the current reached steady-state, the radiant flux emitted from the panel was recorded and the panel's external quantum efficiency was calculated.

The current, radiant flux, and external quantum efficiency of the panel are determined as a function of number of devices connected. The applied bias was N×3V, where N is the number of devices across which the bias was applied. The current was found to be constant, as expected in this configuration. The radiant flux, on the other hand, increased with the number of devices. A linear fit indicated a radiant flux of $1.1\times10^{-5}$ W per device. The external quantum efficiency (for the whole panel) increases linearly with the number of devices, yielding 0.6% external quantum efficiency per device. The power efficiency of the panel was independent on the number of devices.

The fact that the quantum efficiency of the panel is proportional to the number of devices indicates the absence of rectification in both the current and the radiant flux of individual devices. This arises from the fact that the same electrode (ITO and gold in this case) may act as an efficient anode as well as an efficient cathode in [Ru(dtb-bpy)$_3$]$^{2+}$ (PF$_6$)$^-_2$ devices. This result is generally not possible in traditional OLED's, which require high and low work function electrodes as anodes and cathodes, respectively.

This exemplary architecture may not be desirable for use in ruthenium complex based devices that use aluminum electrodes. Such devices show asymmetry due to chemical reactions of the metal with the counter ions as disclosed by Rudmann et al. in J. Appl. Phys. 90, 4338 (2001) and Gorodetsky, et al. Gorodetsky, et al. also disclose that a small amount of rectification may be observed in devices with evaporated gold electrodes, at low voltages and immediately after preparation. However, Gorodetsky, et al. found that the rectification may disappear a few days after sample preparation and/or at higher voltages, and the exemplary devices may show a symmetric response.

FIG. 6 shows an exemplary horizontally cascaded OEL structure with two layers of devices. One may visualize this exemplary structure as the merger of the exemplary structure of FIG. 5 and a mirror image of the exemplary structure of FIG. 5. Electrodes 502 and 506 are now in the middle of the mixed conductor, like middle electrodes coupled between two juxtaposed electroluminescent layers. Cover layer 600 is coupled to new opposing electrodes 602, 606, and 608. Electrodes 602 and 608 are coupled to voltage leads 604 and 610, respectively. It is noted that voltage leads 604 and 610 may be independent to allow separate control of the two layers of OEL devices within this exemplary structure. Alternatively, voltage lead 604 may be coupled to voltage lead 304 and voltage lead 610 may be coupled to voltage lead 312. It is noted that individual middle electrodes may also be coupled to voltage leads to provide further control on the intensity of the various devices.

FIG. 6 also illustrates the result of a light reflecting layer. The light reflecting layer may be included in cover layer 600 (or may be cover layer 600, as shown) so that the light emitted from the structure to one side (top) may be reflected back to the other side (bottom) and increase the amount of light emitted from the device per area. The placement of the reflecting layer is not limited to one side of the device, but may be used on the opposing side in those areas from which light emission is not desired. Alternatively, the light reflecting layer may also be inserted within the middle layers of the light emitting device so that different amounts of light may be reflected in each direction.

Figure 7:
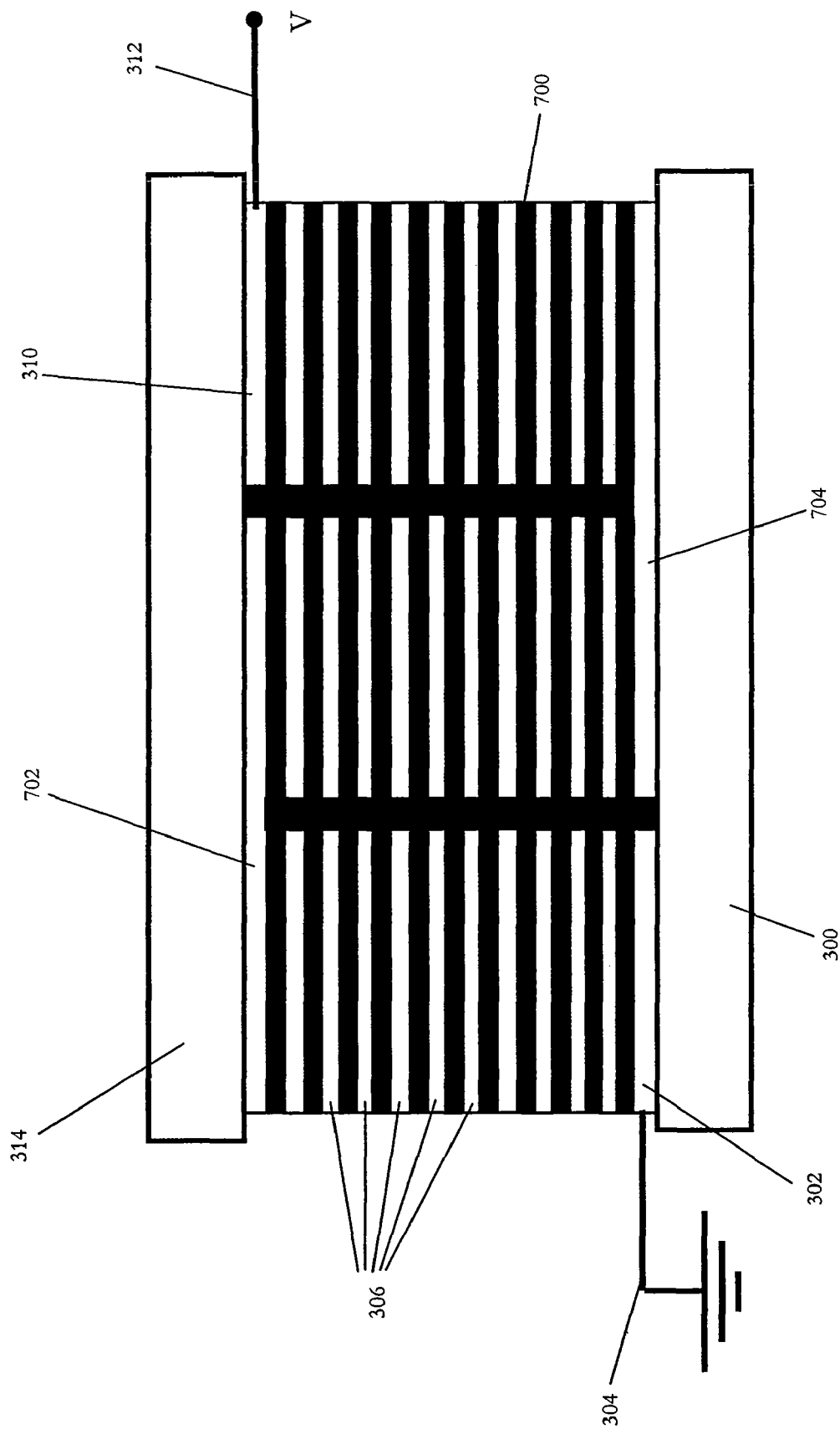
FIG. 7 is a cut away side plan drawing illustrating an exemplary cascaded, stacked mixed conductor OEL device according to the present invention.

FIG. 7 illustrates an exemplary embodiment with a stacked cascaded structure that emits light multiply from one pixel as well as fault tolerant structure which still does not require patterning of light emitting layer. In this exemplary OEL structure, the split electrode formed on substrate 300 includes unevenly sized electrode portions 302 and 704, and the opposing electrode formed on mixed conductor material 700 includes unevenly sized electrode portions 702 and 310. Mixed conductor material 700 is separated by a number of middle electrode layers 306. Each middle electrode portion is sized and arranged to substantially overlay one of electrode portions 302 or 704 of the split electrode structure. The exemplary middle electrodes in FIG. 7 are separated into three rows, the first overlaying electrode portion 302 and the second two overlaying portions of electrode portion 704. One may see that the current in this exemplary may flow in a serpentine pattern along these rows of middle electrodes and longer electrode sections 702 and 704.

A further exemplary cascaded OEL device structure may allow a reduction of the non-light emitting area due to electrode patterning. This may be achieved by shifting each middle electrode layer. Between side-by-side electrodes, there is negligible current flow if the gap is much larger than the thickness of light emitting layer. Therefore, no light is emitted from this area and output intensity is nearly zero, except for diffused light from the pixels. This non-lighting area may be perceived as undesirable by human eyes and may undesirably be detectable by optical devices such as CCD or CMOS cameras. Using a double structure similar to FIG. 6, the third electrode layer may be shifted so that the gap between side-by-side 1st layer electrodes is covered by emission from the second light emitting layer. Similarly, an additional third light emitting layer may be shifted accordingly to cover the gap of the second layer electrodes. It may be possible to have no non-emitting area exist within the exemplary structure.

The driving of exemplary OEL devices according to the present invention may be done using either direct current (DC), alternating current (AC), or a combination of DC and AC signals. As described above, ITO/[Ru(dtb-bpy)$_3$]$^{2+}$ (PF$_6$)$^-_2$/Au devices may be made that show no rectification. This property is due to the reversibility of mixed conductors illustrated in FIGS. 1C and 1D and, thus, may be extended to exemplary OEL devices based on other mixed conductors.

With AC signal operation, the end electrodes of the exemplary OEL device alternately act as anodes and cathodes due to the nature of the mixed conductor. Because of this property, one can make an exemplary OEL device that may be operated using true AC. Light emitting diode devices, including OLED's, may not be operated under true AC, unless they are operated at a 50% duty cycle, due to their diode nature.

Figure 8:
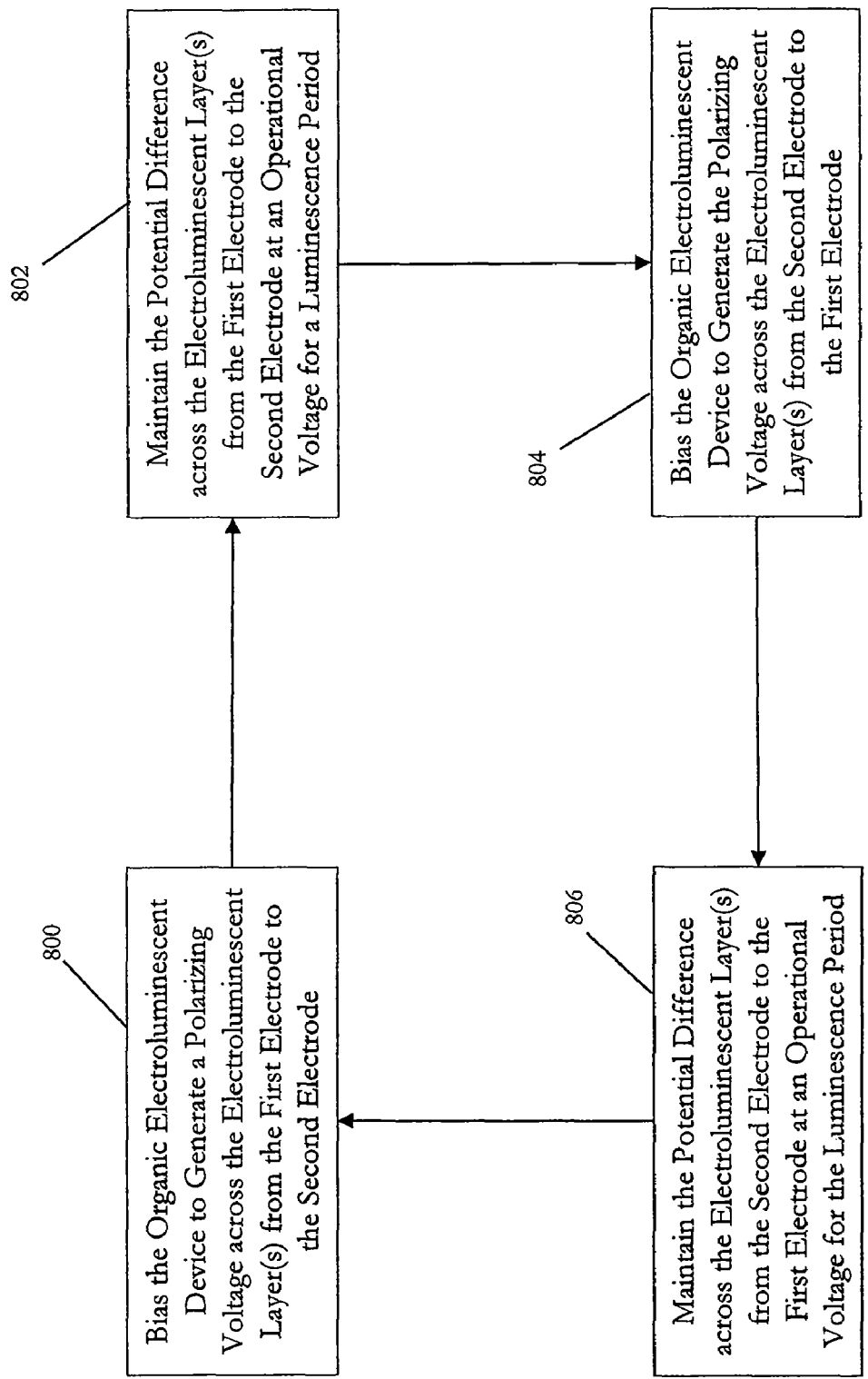
FIG. 8 is a flow chart illustrating an exemplary method of driving an OEL device using alternating current according to the present invention.

FIG. 8 illustrates an exemplary method for driving an OEL device using AC. To increase turn-on speed of the OEL device using a mixed conductor, an activation signal may applied before the period of the operational signal. This involves biasing the OEL device to generate a polarizing voltage across its electroluminescent layer(s) from a first electrode to a second electrode, step 800. The polarization voltage is greater than or equal to the voltage necessary to induce band bending in the mixed conductor and to polarize the mixed conductor. This makes the turn-on faster than the case where the operational signal is applied without an activation signal.

The potential difference across the electroluminescent layer(s) from the first electrode to the second electrode is maintained above an operational voltage for a predetermined luminescence period, step 802. The operational voltage is typically less the polarizing voltage, but is, of course, sufficient to drive the electroluminescence in the polarized mixed conductor.

A reverse activation signal is sent following the luminescence period by biasing the OEL device so as to generate the polarizing voltage across the electroluminescent layer(s) from the second electrode to the first electrode, step 804. The potential difference across the electroluminescent layer(s) from the second electrode to the first electrode is then maintained above the operational voltage for the predetermined luminescence period, step 806. These steps are repeated. Desirably this may lead to a period AC driving signal. Exemplary waveforms of the AC driving signal may include sine wave, triangle wave, square wave, rectangular wave, tangent wave, trapezoidal wave, and sawtooth wave.

Figure 9:
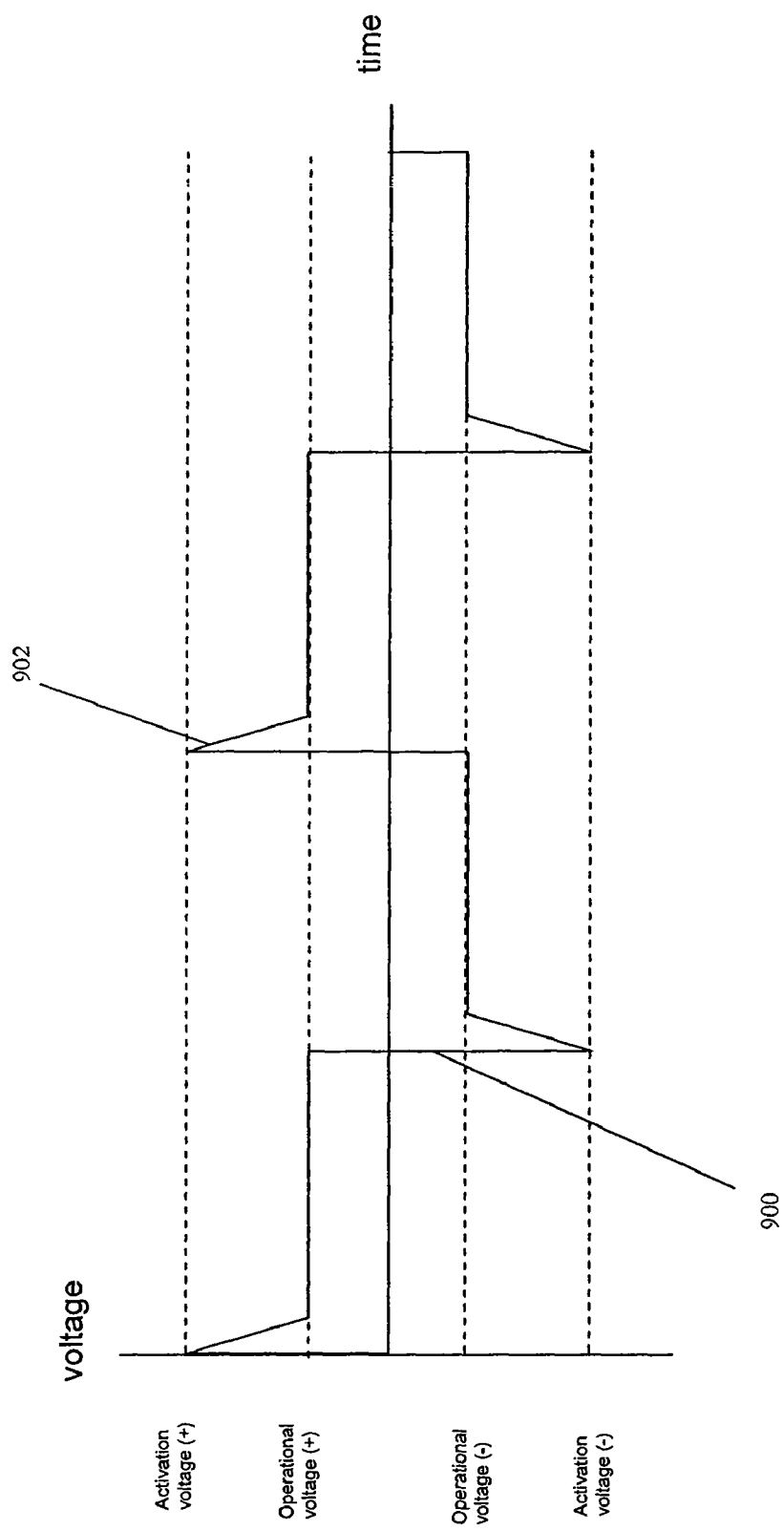
FIG. 9 is a graph of voltage versus time illustrating an exemplary driving voltage signal for use with the exemplary method of FIG. 8.

An example of a driving signal that may be used in the exemplary method of FIG. 8 is this spiked square wave driving signal 900 of FIG. 9. In this exemplary waveform, activation signal 902 is a short duration spike followed by a relatively long, constant voltage level at the operational voltage. The level of the operational voltage may be chosen to provide the desired output intensity.

The architecture described in FIG. 5 may enable the fabrication of panels that operate directly with domestic AC electricity, which typically has a frequency of 50 Hz or 60 Hz. Since $_{ITO/[Ru(dtb-bpy)_3]}$$^{2+}$ (PF$_6$)$^-_2$/Au devices can be made to show no rectification, they can, in principle, be efficiently driven with an AC bias, straight out of a wall outlet. Unfortunately, due to the low mobility of the (PF$_6$)$^-$ counter ions, the speed of [Ru(dtb-bpy)$_3$]$^{2+}$ (PF$_6$)$^-_2$ devices is not adequate to allow such a panel to be driven at 60 Hz. However, other transition metal complexes that show the necessary response time for direct use of domestic electricity or even higher frequencies, possibly into the kilohertz range, may be developed. The use of waveforms with activation signals, such as the waveform shown in FIG. 9, may be particularly useful for higher frequency operation.

In addition to the potential advantages of being able to power exemplary OEL devices directly with domestic AC electricity, AC driving of exemplary OEL devices may increase the device lifetime by switching the polarization of the mixed conductor material back and forth, rather than burning in the polarization in one direction.

Figure 10:
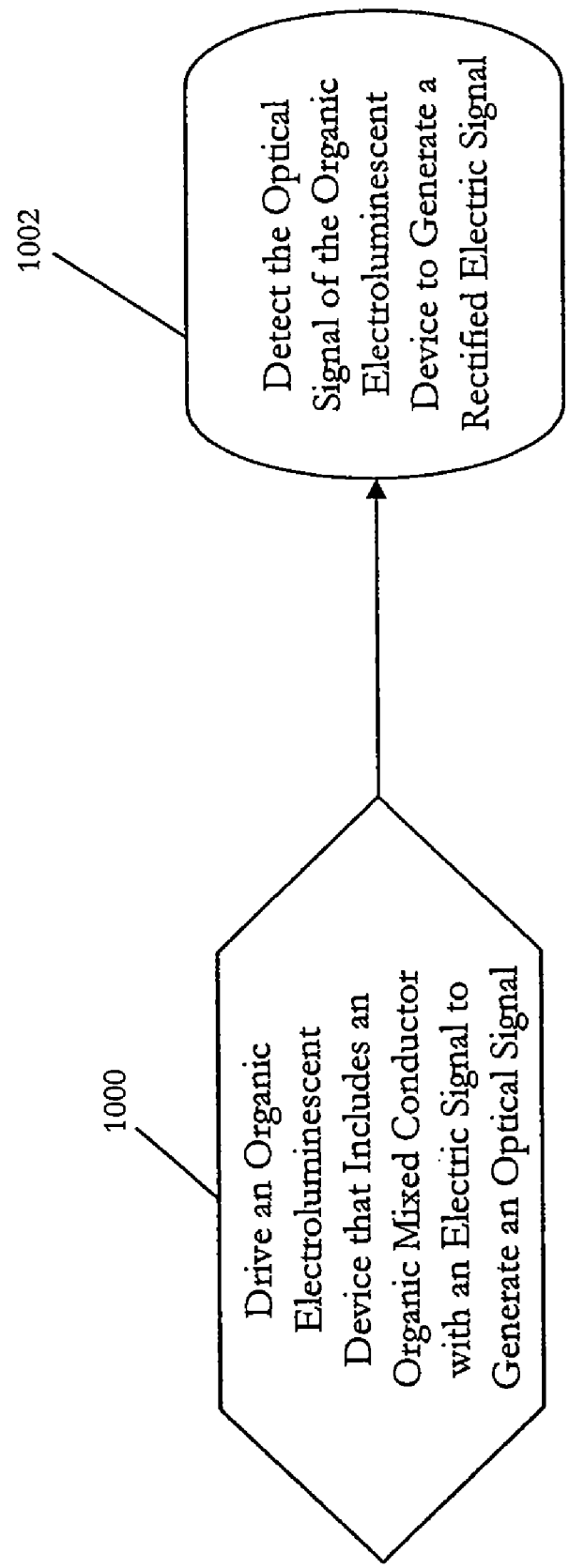
FIG. 10 is a flow chart illustrating an exemplary method of rectifying an electrical signal using an OEL according to the present invention.

Also, due to reversibility of exemplary OEL devices, an electrical signal used as a driving signal may be rectified as optical signal, i.e. a positive voltage gives light emission and a negative voltage gives light emission. FIG. 10 illustrates an exemplary method of using OEL devices to rectify an electric signal having a varying voltage. An OEL device that includes a mixed conductor is driven with the electric signal to generate an optical signal having an intensity proportional to the absolute value of the varying voltage of the electric signal, step 1000. The optical signal of the OEL device is then detected to generate the rectified electric signal, step 1002. If the signal is not originally centered about zero volts, it may be desirable for a DC bias voltage to be added to the electric signal such that a range of the varying voltage is centered on about zero volts.

Another exemplary embodiment of the present invention is a method of doubling the peak frequency of a periodic electrical signal. For example, 100 Hz AC electrical signal generates a 200 Hz optical emission from an exemplary OEL device. The 200 Hz optical signal may be converted back into a frequency doubled electrical signal through optical-multiplier or some other techniques. One may call such device an electro-opto-electro frequency converter.

The present invention includes a number of embodiments of cascaded OEL devices using mixed conductors and exemplary methods to drive OEL's based on mixed conductors. The use of these exemplary cascaded OEL devices allows increased optical power output as well reducing the susceptibility of these devices to faults, such as shorts. Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A cascaded light emitting device, comprising:
    a split electrode structure formed of a first electrode material, the split electrode structure including a plurality of separate electrode portions, the plurality of electrode portions including a first electrode portion electrically coupled to a first voltage lead and a second electrode portion electrically coupled to a second voltage lead;
    an opposing electrode formed of a second electrode material; and
    at least one electroluminescent layer coupled between the split electrode structure and the opposing electrode, the at least one electroluminescent layer including a mixed conductor that luminesces with a peak wavelength, a total thickness of the at least one electroluminescent layer being such that a resistance across the at least one electroluminescent layer between an electrode portion of the split electrode structure and the opposing electrode is less than half of resistance between adjacent electrode portions of the split electrode structure,
    wherein the cascaded light emitting device forms a current path from the first electrode portion of the split electrode structure to the opposing electrode and from the opposing electrode to the second electrode portion of the split electrode structure.

2. The cascaded light emitting device according to claim 1, wherein at least one of the first electrode material or the second electrode material is substantially transmissive to light having the peak wavelength.

3. The cascaded light emitting device according to claim 1, wherein one of the split electrode structure or the opposing electrode is formed on a substrate formed of a substrate material that is substantially electrically insulating.

4. The cascaded light emitting device according to claim 1, wherein the opposing electrode forms a substrate of the cascaded light emitting device.

5. The cascaded light emitting device according to claim 1, wherein:
    one of the first electrode material or the second electrode material is substantially transmissive to light having the peak wavelength; and
    another one of the first electrode material or the second electrode material is substantially reflective to light having the peak wavelength.

6. The cascaded light emitting device according to claim 1, wherein:
    the first electrode material includes at least one of a metal conductor, a metal alloy conductor, an oxide conductor, a ceramic conductor, a carbon-based conductor, a polymer conductor, an electrolyte, an ionic conductor, or a composite material formed of a conductor in a non-conducting matrix; and
    the second electrode material includes at least one of a metal conductor, a metal alloy conductor, an oxide conductor, a ceramic conductor, a carbon-based conductor, a polymer conductor, an electrolyte, an ionic conductor, or a composite material formed of a conductor in a non-conducting matrix.

7. The cascaded light emitting device according to claim 1, wherein the opposing electrode is electrically coupled to at least one opposing voltage lead.

8. The cascaded light emitting device according to claim 1, wherein the mixed conductor is at least one of a transition metal complex or an ionic liquid.

9. The cascaded light emitting device according to claim 1, further comprising:
    at least one middle electrode layer formed of a middle electrode material; wherein;
        the at least one electroluminescent layer is a plurality of electroluminescent layers; and
        each middle electrode layer is coupled between two juxtaposed electroluminescent layers of the plurality of electroluminescent layers.

10. The cascaded light emitting device according to claim 2, wherein the one of the split electrode structure or the opposing electrode formed on the substrate and the substrate material are substantially transmissive to light having the peak wavelength.

11. The cascaded light emitting device according to claim 2, wherein the substrate material is substantially reflective to light having the peak wavelength.

12. The cascaded light emitting device according to claim 2, wherein a cover layer formed of a cover material that is substantially electrically insulating is coupled to one of the split electrode structure or the opposing electrode not formed on the substrate.

13. A cascaded light emitting device comprising:
    a split electrode structure formed of a first electrode material, the split electrode structure including a plurality of separate electrode portions, the plurality of electrode portions including a first electrode portion electrically coupled to a first voltage lead and a second electrode portion electrically coupled to a second voltage lead;
    an opposing electrode formed of a second electrode material, the opposing electrode including a plurality of separate opposing electrode portions; and
    at least one electroluminescent layer coupled between the split electrode structure and the opposing electrode, the at least one electroluminescent layer including a mixed conductor that luminesces with a peak wavelength, a total thickness of the at least one electroluminescent layer being such that a resistance across the at least one electroluminescent layer between an electrode portion of the split electrode structure and the opposing electrode is less than half of a resistance between adjacent electrode portions of the split electrode structure, wherein the opposing electrode is sized and arranged such that each of the opposing electrode portions extends across a separation between two of the plurality of electrode portions of the split electrode structure.

14. The cascaded light emitting device according to claim 9, wherein the middle electrode material includes at least one of a metal conductor, a metal alloy conductor, an oxide conductor, a ceramic conductor, a carbon-based conductor, a polymer conductor, an electrolyte, an ionic conductor, or a composite material formed of a conductor in a non-conducting matrix.

15. The cascaded light emitting device according to claim 9, wherein the at least one middle electrode layer includes a plurality of middle electrode portions.

16. The cascaded light emitting device according to claim 9, wherein each middle electrode layer includes at least one middle electrode portion that is sized and arranged to:
   extend across a separation between two of the plurality of electrode portions of the split electrode structure; or
   substantially overlay one of the plurality of electrode portions of the split electrode structure.

17. The cascaded light emitting device according to claim 15, wherein the at least one middle electrode layer includes a middle electrode portion electrically coupled to a middle voltage lead.

* * * * *

UNITED STATES PATENT AND TRADEMARK OFFICE
CERTIFICATE OF CORRECTION

| | | |
|---|---|---|
| PATENT NO. | : 8,063,556 B2 | Page 1 of 1 |
| APPLICATION NO. | : 12/691905 | |
| DATED | : November 22, 2011 | |
| INVENTOR(S) | : George G. Malliaras et al. | |

It is certified that error appears in the above-identified patent and that said Letters Patent is hereby corrected as shown below:

Column 13, claim 1, line 53, after the words "half of" please insert the word --a--.

Signed and Sealed this
Fifteenth Day of May, 2012

David J. Kappos
*Director of the United States Patent and Trademark Office*